(12) United States Patent  (10) Patent No.: US 8,754,333 B2
Yoshimura et al.  (45) Date of Patent: Jun. 17, 2014

(54) PRINTED CIRCUIT BOARD INCORPORATING FIBERS

(75) Inventors: Hideaki Yoshimura, Kawasaki (JP); Kenji Iida, Kawasaki (JP); Yasutomo Maehara, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 186 days.

(21) Appl. No.: 13/269,212

(22) Filed: Oct. 7, 2011

(65) Prior Publication Data

US 2012/0097442 A1  Apr. 26, 2012

(30) Foreign Application Priority Data

Oct. 22, 2010 (JP) ................. 2010-237990

(51) Int. Cl.
*H05K 1/03* (2006.01)
*H05K 1/11* (2006.01)
*B29C 45/14* (2006.01)

(52) U.S. Cl.
USPC ............ 174/255; 174/256; 174/262; 264/257

(58) Field of Classification Search
USPC ......... 174/250, 252, 255, 258, 266, 256, 262; 361/760; 264/257
See application file for complete search history.

(56) References Cited

U.S. PATENT DOCUMENTS

| | | | | |
|---|---|---|---|---|
| 4,707,565 A | * | 11/1987 | Kasai et al. | 174/255 |
| 4,980,217 A | * | 12/1990 | Grundfest et al. | 428/113 |
| 5,997,983 A | * | 12/1999 | Caron et al. | 428/105 |
| 7,224,046 B2 | | 5/2007 | Abe | |
| 8,110,749 B2 | | 2/2012 | Yoshimura et al. | |
| 2003/0157307 A1 | * | 8/2003 | Suzuki et al. | 428/209 |
| 2005/0034893 A1 | * | 2/2005 | McCall et al. | 174/255 |
| 2008/0186687 A1 | * | 8/2008 | Lin et al. | 361/751 |

FOREIGN PATENT DOCUMENTS

| | | |
|---|---|---|
| JP | 10-117048 | 5/1998 |
| JP | 2001-332828 A | 11/2001 |
| JP | 2002-204057 | 7/2002 |
| JP | 2003-124395 | 4/2003 |
| JP | 2003-142826 A | 5/2003 |
| JP | 2003-324253 A | 11/2003 |
| JP | 2004-289114 A | 10/2004 |
| JP | 2009-302459 | 12/2009 |
| KR | 2005-0062654 | 6/2005 |
| KR | 10-2009-0124915 A | 12/2009 |

OTHER PUBLICATIONS

Notice of Preliminary Rejection dated Nov. 14, 2012, from corresponding to Korean Application No. 10-2011-0108226 with English-language translation.

(Continued)

*Primary Examiner* — Jeremy C Norris
*Assistant Examiner* — Sherman Ng
(74) *Attorney, Agent, or Firm* — Fujitsu Patent Center

(57) ABSTRACT

A printed circuit board includes a cell portion which includes cells having a plurality of through bores are arranged in a base material; and a base material portion which exists around an outer edge of the cell portion. The base material is formed of a prepreg, the prepreg includes a fiber material in which fiber threads are oriented in a first direction and in a second direction which is perpendicular to the first direction, and a resin material in which the fiber material is impregnated. The through bores are arranged along a third direction between the first direction and the second direction, wherein one side of the outer edges of the cell extends along the third direction.

7 Claims, 15 Drawing Sheets

(56) References Cited

OTHER PUBLICATIONS

Korean Office Action mailed May 22, 2013 for corresponding Korean Application No. 10-2011-108226, with English-language Translation.

Korean Office Action mailed Nov. 14, 2013 for corresponding Korean Application No. 10-2011-108226, with English-language Translation.

Office Action of Japanese Patent Application No. 2010-237990 dated Feb. 25, 2014 with Partial English Translation.

* cited by examiner

PRINTED CIRCUIT BOARD INCORPORATING FIBERS

CROSS-REFERENCE TO RELATED APPLICATIONS

This application is based upon and claims the benefit of priority of the prior Japanese Patent Application No. 2010-237990, filed on Oct. 22, 2010 the entire contents of which are incorporated herein by reference.

FIELD

The present invention relates to a printed circuit board in which a prepreg material is incorporated.

BACKGROUND

Typically, the coefficient of thermal expansion of a printed circuit board on which a large scale integration (LSI) or an LSI package is mounted is about 17 ppm/degrees C. The coefficient of thermal expansion is determined depending on the material of copper wiring patterned on the substrate (i.e., a base material). Recently, however, there have been needed printed circuit boards of low coefficient of thermal expansion of about 3 to 3.5 ppm/degrees C., which is about the coefficient of thermal expansion of a silicon wafer.

Examples of materials used for such printed circuit boards of low coefficient of thermal expansion include resin materials of low coefficient of thermal expansion, such as bismaleimide triazine resin (BT resin). A prepreg (i.e., "pre-impregnated") material is used as a base material of the printed circuit board. The prepreg material is prepared through impregnation of a resin material in a fiber material, such as glass. In order to prepare materials of lower coefficient of thermal expansion, not only the resin materials but the fiber materials are suitably selected. For example, instead of using a general E glass fiber (coefficient of thermal expansion: about 5.5 ppm/degrees C.; modulus of elasticity: about 70 GPa), a low coefficient thermal expansion glass fiber such as a T glass fiber (coefficient of thermal expansion: about 3 ppm/degrees C.; modulus of elasticity: about 80 GPa), is used. The suitable selection of the resin material and fiber material achieves a base material of a printed circuit board of low coefficient of thermal expansion. However, even if materials are thus selected, it is still difficult to achieve coefficient of thermal expansion closer to that of a silicon wafer since the coefficient of thermal expansion of the base material of the printed circuit board is about 12 ppm/degrees C. or greater because the coefficient of thermal expansion of the resin material has restriction.

Examples of the fiber materials used as the prepreg include fiber threads (i.e., yarns) which are a bunch of thin glass fibers called filaments. These fiber threads are knitted alternately in horizontal and vertical directions to form fabric. Alternatively, these fiber threads are arranged closely and in parallel on a plane (i.e., not woven, to form nonwoven fabric). The prepreg material is prepared through impregnation of resin in the fabric or nonwoven fabric to form semi-cured resin (B-stage resin). Here, it is proposed, for example, to flatten the fabric under pressure or knit the fabric using extended flat bundles of threads. These techniques are implemented to obtain thin prepreg materials.

The printed circuit board typically has through holes which penetrate the substrate. In the printed circuit board in which a prepreg material is incorporated, the fiber material (i.e., the fiber threads) of the prepreg material is cut at through hole sites. Therefore, a difference in coefficient of thermal expansion exists in the horizontal and vertical directions of the substrate depending on the positions in which the through holes are formed. Such a difference in the coefficient of thermal expansion causes a difference in coefficient of thermal expansion in the horizontal and vertical directions. The property of a substrate with different physical property in the horizontal and vertical directions is called "anisotropy."

It is therefore needed to reduce anisotropy of a substrate in a printed circuit board in which a prepreg material is incorporated.

Related art is disclosed in Japanese Laid-open Patent Publication No. 2004-289114, Japanese Laid-open Patent Publication No. 2003-324253, Japanese Laid-open Patent Publication No. 2003-142826, and Japanese Laid-open Patent Publication No. 2001-332828.

Related art is also described in the following Nonpatent literatures: Tohru YAMAGISHI et al., "Structural Analysis of Anisotropic Composite Structures by FEM (Part I)", 1999.; and S. W. Tsai, "Structural Behavior of Composite Materials, NASA CR-71, 1964."

SUMMARY

According to one aspect of the invention, a printed circuit board includes a cell portion having cells in which a plurality of through bores are arranged in a base material; and a base material portion which exists around an outer edge of the cell portion, wherein the base material is formed of a prepreg, the prepreg includes a fiber material in which fiber threads are oriented in a first direction and in a second direction which is perpendicular to the first direction, and a resin material in which the fiber material is impregnated; and the through bores are arranged along a third direction between the first direction and the second direction, wherein one side of the outer edges of the cell extends along the third direction.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DETAILED DESCRIPTION OF THE EMBODIMENTS

Hereinafter, embodiments will be described.

Figure 11:
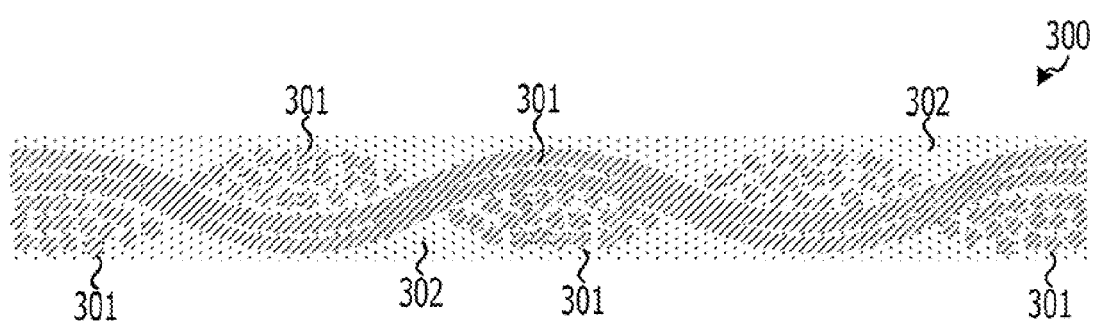
FIG. 11 is a sectional view of a prepreg material in which fabric of glass fibers is incorporated.
Figure 12:
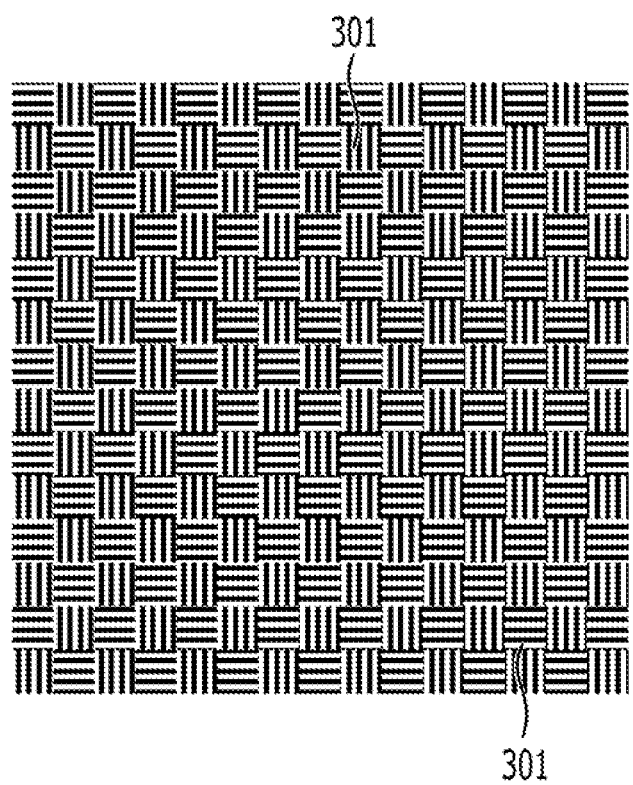
FIG. 12 is a plan view illustrating a part of fabric of glass fibers.

FIG. 11 is a sectional view of a prepreg material in which fabric of glass fibers is incorporated. FIG. 12 is a plan view illustrating a part of fabric of glass fibers. A prepreg material 300 illustrated in FIG. 11 is prepared through impregnation of plain-woven fabric in resin 302; fiber threads 301 are alternately knitted in the horizontal and vertical directions to make the plain-woven fabric. The fiber threads 301 are typically glass fibers called E glass. The resin 302 herein is epoxy resin. A printed circuit board formed of such a material has a coefficient of thermal expansion of about 17 ppm/degrees C. The printed circuit board has such a high coefficient of thermal expansion because of the epoxy resin which has a coefficient of thermal expansion of several tens of ppm/degrees C. although the coefficient of thermal expansion of the E glass fiber is as low as about 5.5 ppm/degrees C. The coefficient of thermal expansion of about 17 ppm/degrees C. matches with a coefficient of thermal expansion of copper wiring used as wiring of the printed circuit board.

In order to obtain a coefficient of thermal expansion closer to the silicon wafer, it is proposed to replace the glass fibers with organic fibers, such as aramid fibers, and inorganic fibers, such as carbon fibers. The above listed fibers have elasticity as high as about 100 GPa or higher and have low coefficient of thermal expansion of 1 ppm/degrees C. or lower. Typically, organic fibers are insulating materials while inorganic fibers are conductive materials.

Figure 13:
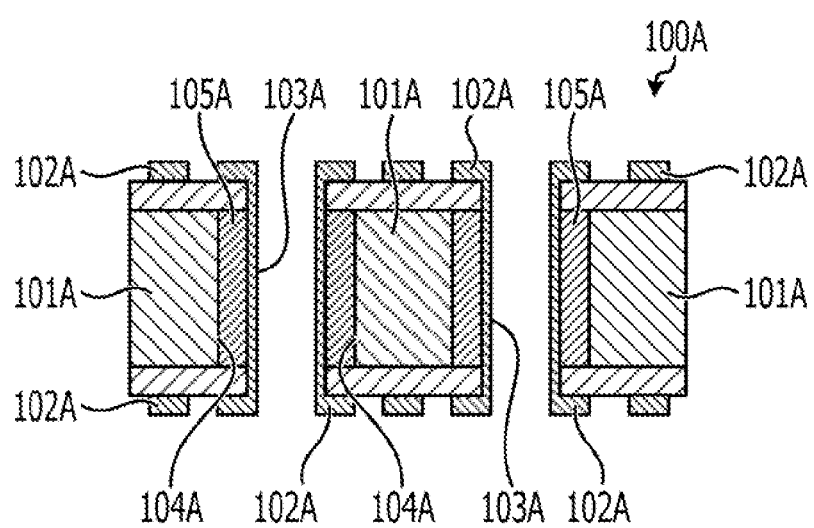
FIG. 13 is a sectional view of a printed circuit board in which a conductive base material is incorporated.

A printed circuit board to which such an improvement has been made will be described. FIG. 13 is a sectional view of a printed circuit board in which a conductive base material is incorporated. In a printed circuit board 100A illustrated in FIG. 13, a conductive material of the low coefficient of thermal expansion, such as carbon fiber, is used as a base material 101A. In this case, in the printed circuit board 100A, since the base material 101A is a conductive material, it is required to electrically insulate the through holes 103A connected to a wiring layer 102A from the base material 101A (for the ease of description, conductive layers formed on inner walls of through bores are called "through holes 103A"). Therefore, in the printed circuit board 100A, lower holes 104A having a diameter larger than that of the through holes 103A are formed at portions at which the through holes 103A will be formed. Inner surfaces of the lower holes 104A are covered with resin materials 105A, such as epoxy resin. In this manner, the base material 101A and the through holes 103A are electrically insulated from each other with the resin materials 105A. That is, the lower holes 104A are covered with a layer of the resin materials 105A and a layer of the through holes 103A laminated on the layer of the resin materials 105A.

The printed circuit board typically has through holes which penetrate the base material. In the printed circuit board in which the above-described prepreg material is incorporated, the base material is cut at portions at which the through holes are formed. That is, the fiber material and the resin material of the prepreg material are cut at portions of the through bores of the through holes (i.e., the lower holes) formed in the base material.

At this time, since the coefficient of thermal expansion of the resin material is significantly higher than that of the fiber material, the through holes affect the coefficient of thermal expansion of the base material. Especially when the through holes are not regularly arranged, a difference may arise in the coefficient of thermal expansion of the vertical direction and the coefficient of thermal expansion of the horizontal direction. As a result, anisotropy arises in the base material.

Figure 14:
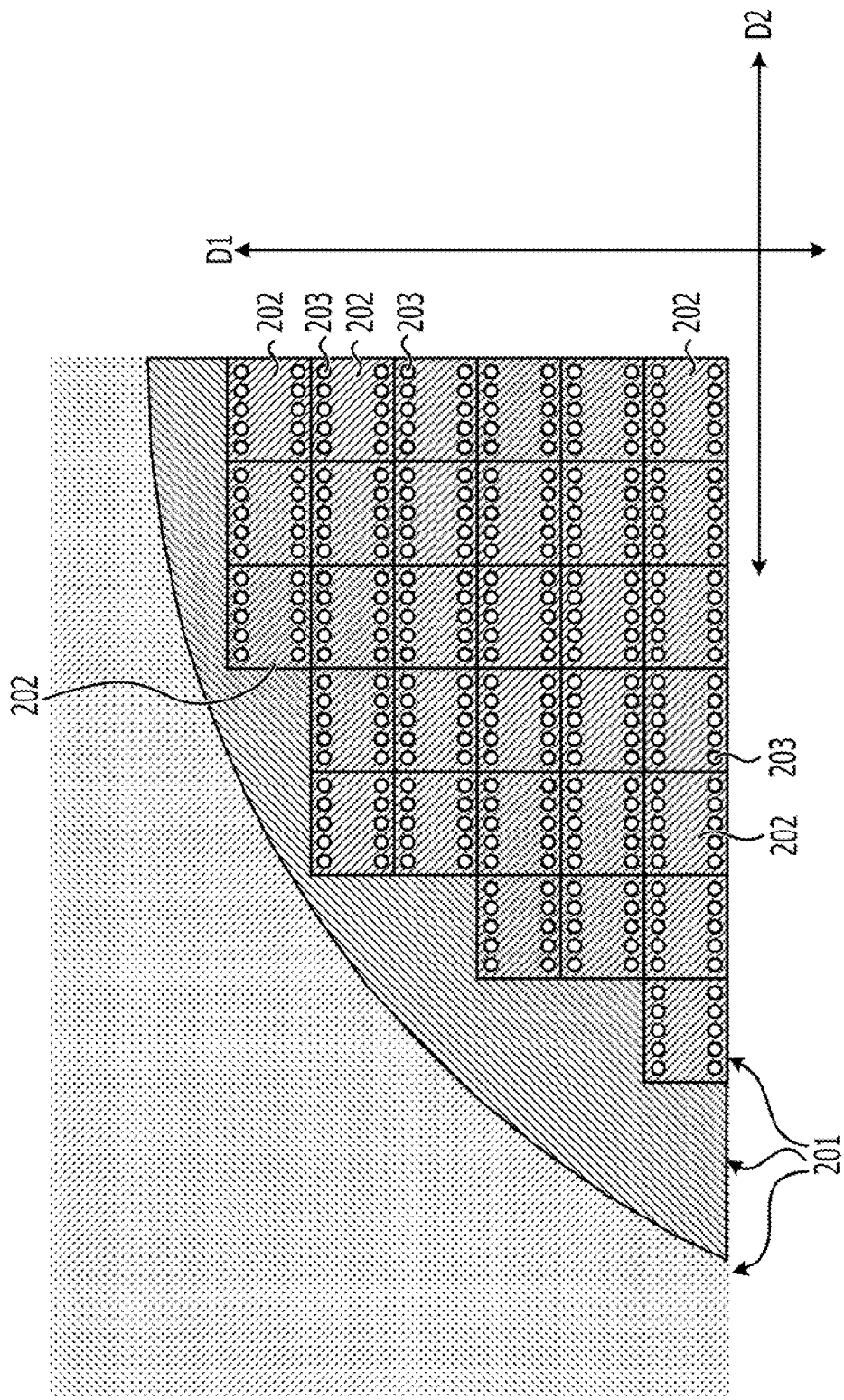
FIG. 14 is a plan view illustrating a part of a printed circuit board.

FIG. 14 is a plan view illustrating a part of a printed circuit board. For the ease of description, positions at which the through holes exist (hereinafter, called "through hole sites") are illustrated by white circles. The base material 201 of the printed circuit board illustrated in FIG. 14 includes, for example, fabric in which glass fiber threads are knitted in horizontal and vertical directions. This fabric is prepared by knitting, in the horizontal and vertical directions, the fiber threads in a fiber direction D1 and the fiber threads in a fiber direction D2 which is perpendicular to the fiber direction D1.

As illustrated in FIG. 14, a plurality of cells 202 corresponding to electronic components, such as semiconductor chips, are defined on a surface section (i.e., a front surface or a back surface) of the base material 201. FIG. 14 illustrates an example in which a plurality of cells 202 corresponding to electronic components are imposed on the surface section. For example, the cells 202 are used as a substrate of a probe card for inspecting a semiconductor wafer in which the cells 202 are not separated from each other; or as package substrates prepared by separating into individual cells 202 after electronic components are mounted thereon.

In particular, the cells 202 are arranged regularly on the surface section of the base material 201 along the fiber direction D1 (i.e., the first direction) and the fiber direction D2 (i.e., the second direction). The fiber direction D2 is a direction perpendicular to the fiber direction D1.

Electronic components (not illustrated) mounted on or connected to each cell 202 includes a plurality of connection terminals (i.e., electrodes). Each cell 202 includes through hole sites 203 at positions corresponding to each of the connection terminals of the electronic components. In this manner, the through hole sites 203 are arranged along the fiber direction D2 which is perpendicular to the fiber direction D1. The cells 202 are, for example, rectangular as illustrated in FIG. 14. One side of outer edges of each cell 202 extends along a direction in which the through hole sites 203 are arranged (i.e., the third direction). That is, one side of outer edges of each cell 202 extends along a direction in which the through bores which are lower holes of the through holes are arranged (i.e., the third direction).

Figure 15:
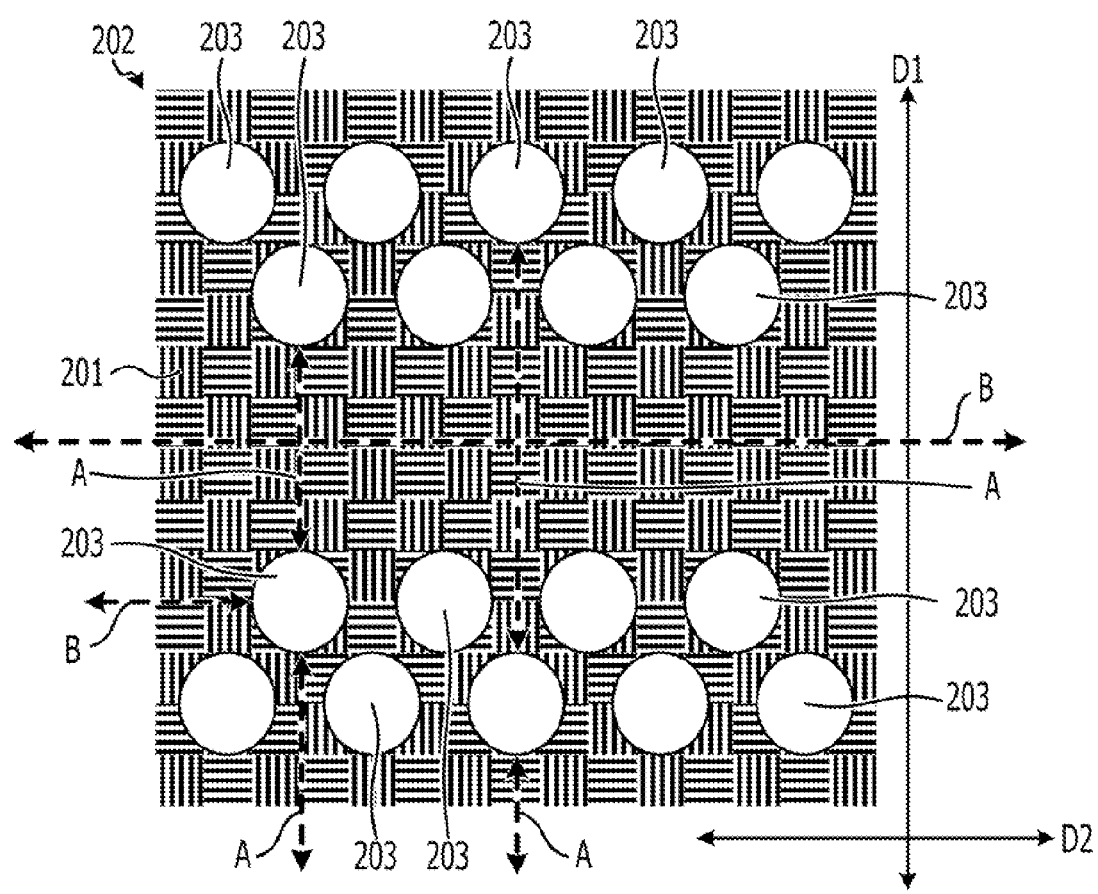
FIG. 15 is an explanatory view illustrating a relationship between through hole sites and a fiber direction in cells.

FIG. 15 is an explanatory view illustrating a relationship between the through hole sites 203 and the fiber directions D1 and D2 in the cells 202. A plurality of through hole sites 203 are formed in the cell 202 illustrated in FIG. 15 at predetermined intervals along the fiber direction D2. That is, a plurality of through hole sites 203 are arranged at predetermined intervals in a direction of 0 degrees with respect to the fiber direction D2.

As illustrated in cell 202 of FIG. 15, fiber threads of the base material 201 are cut depending on the positions of the through hole sites 203. Thus, the length (i.e., fiber length) of the fiber threads vary as illustrated by a dotted line (arrow A and arrow B) in FIG. 15. Arrows A and B of the dotted line schematically represent the fiber threads which has been cut. The coefficient of thermal expansion of the prepreg material depends on the fiber length of the fiber threads included therein. Therefore, a difference in coefficient of thermal expansion in the horizontal and vertical directions arises in the cells 202.

When actual coefficient of thermal expansion is simulated regarding the cells 202 illustrated in FIG. 15, the coefficient of thermal expansion is X<Y when the coefficient of thermal expansion in the fiber direction D2 is X and the coefficient of thermal expansion in the fiber direction D1 is Y. Such a difference in the coefficient of thermal expansion is caused by a difference in state of the cut fiber threads in the fiber direction D2 and in the fiber direction D1. In the example of FIG. 15, the fiber threads along the fiber direction D1 are cut by the through bores of the through hole sites 203 with many fiber threads being cut in a wide range. In comparison, a range in which the fiber threads are cut along the fiber direction D2 is narrower than that in the fiber direction D1. Thus, since the states of the cut fiber threads differ in the fiber direction D2 and in the fiber direction D1, the coefficient of thermal expansion of the cells 202 differs in the fiber direction D2 and in the fiber direction D1.

Hereinafter, detailed description will be made with reference to the drawings.

First Embodiment

Figure 1:
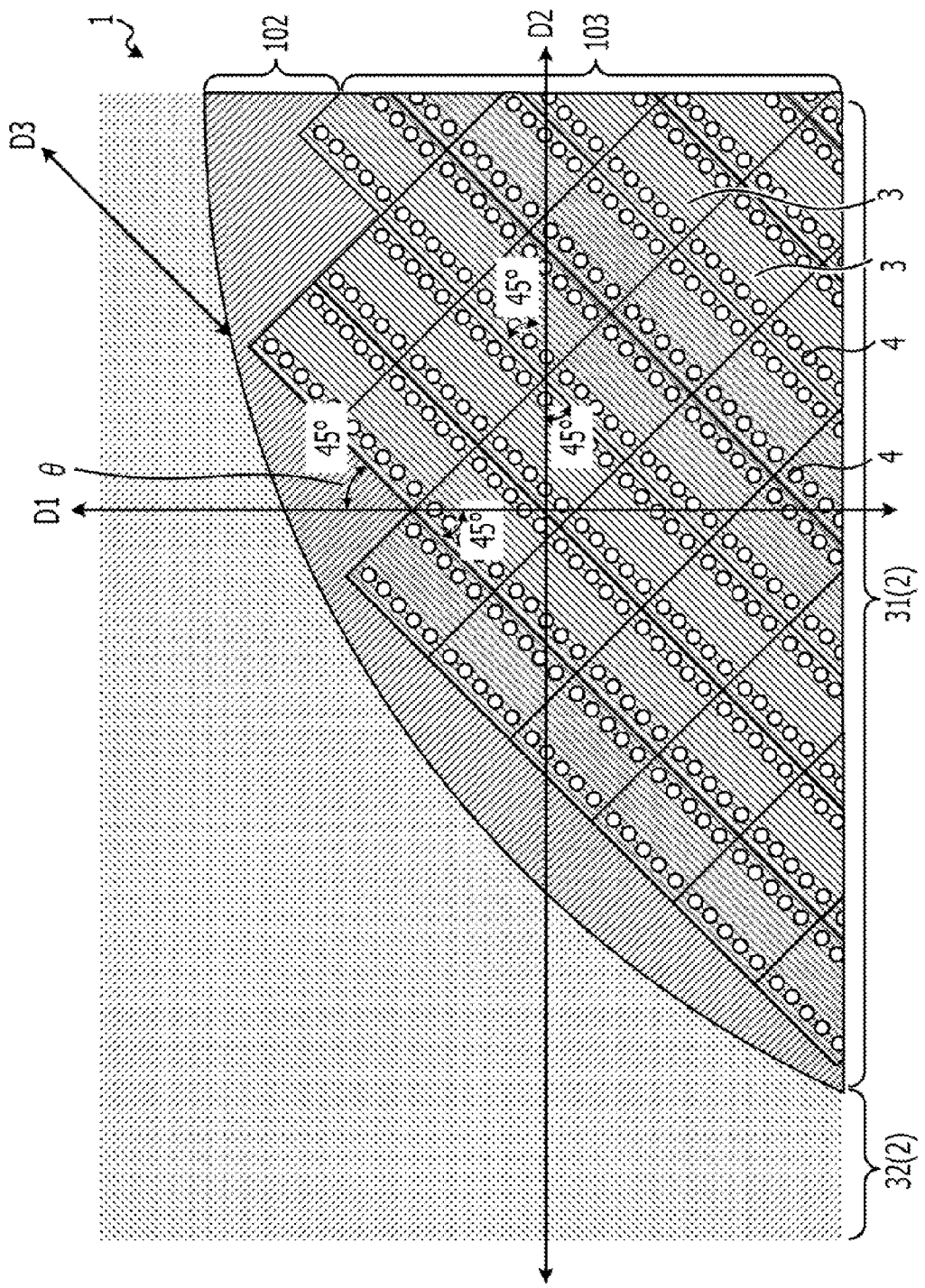
FIG. 1 is a plan view illustrating a part of a printed circuit board of a first embodiment.

FIG. 1 is a plan view illustrating a part of a printed circuit board of a first embodiment. A printed circuit board 1 is divided into a product portion 31 which is used as a product, and an out-of-product portion 32 (i.e., discarded portion) as illustrated in FIG. 1. Although not illustrated in FIG. 1, the shape of an outer edge of the printed circuit board 1 (i.e., a shape of a front surface or a back surface) is, for example, rectangular or square. The product portion 31 is divided into a cell portion 103 in which a plurality of cells 3 are arranged and a base material portion 102 existing around a circumference of the cell portions. Both the product portion 31 and the out-of-product portion 32 are formed from a base material 2 which is formed of a prepreg material. A single electronic component (not illustrated), such as an LSI or an LSI package, corresponds to each of the cell 3. That is, the electronic component is mounted on or connected to each cell 3.

A plurality of through bores 4 are formed in the cell 3. Each of the through bores 4 corresponds to each electrode terminal (i.e., each connection terminal) of the electronic component.

In the base material 2, the fiber threads of the prepreg material are oriented along the fiber direction D1 and the fiber direction D2. The fiber direction D1 is perpendicular to the fiber direction D2. That is, the base material 2 includes the fiber material in which the fiber threads are oriented in the fiber direction D1 (i.e., the first direction) and in the fiber direction D2 (i.e., the second direction). The base material 2 also includes a resin material in addition to the fiber material. The fiber material has been impregnated with the resin material.

The through bores 4 are arranged along a predetermined direction D3 (i.e., the third direction). The third direction is between the first direction and the second direction, as illustrated in FIG. 1. In the first embodiment, the third direction along which the through bores 4 are arranged corresponds to the direction of one of the sides of the outer edges of the cells 3. That is, an inclination in the direction in which the through bores 4 are arranged is the same as an inclination of the cells 3. This means that, if the inclination of the cells 3 with respect to the first direction is defined as an imposing angle (θ), the angle between the first direction and the third direction is the same as the imposing angle. In the printed circuit board 1 illustrated in FIG. 1, the cells 3 are imposed to the base material 2 such that, for example, the imposing angle becomes 45 degrees.

As described above, in the first embodiment, the cells 3 are imposed to the base material 2 such that the angle between the cells 3 and the fiber direction D1 or the fiber direction D2 of the base material 2 is substantially 45 degrees. With this configuration, variation in fiber length in the cells 3 is reduced. For example, a difference between a range in which the fiber threads are cut along the fiber direction D2 and a range in which the fiber threads are cut along the fiber direction D1 becomes small. That is, the cut fiber threads are in the same state in both the fiber direction D2 and the fiber direction D1. Thus anisotropy of the base material 2 can be controlled to the minimum. Capability of minimization of anisotropy of the base material 2 will be described in detail in the next second embodiment.

Second Embodiment

Figure 2:
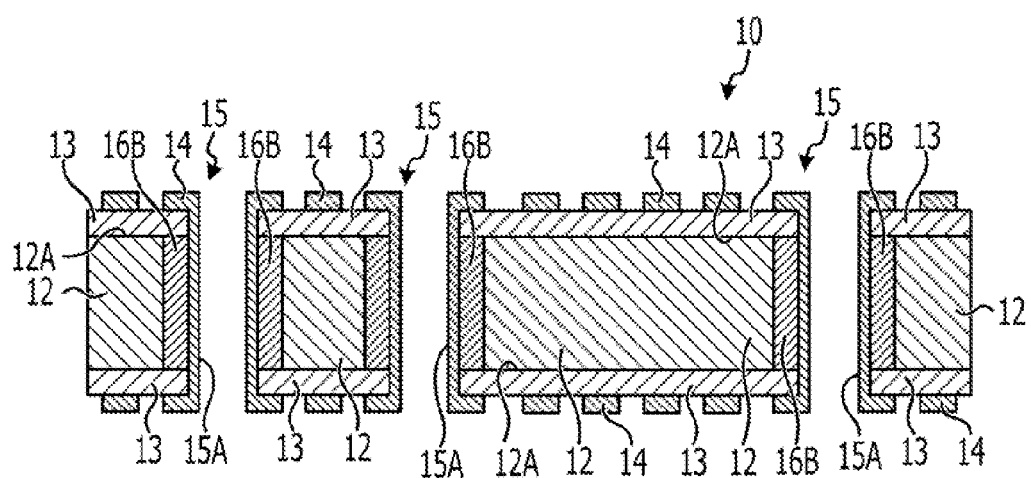
FIG. 2 is a sectional view of a printed circuit board of a second embodiment.

FIG. 2 is a sectional view of a printed circuit board of a second embodiment. A printed circuit board 10 illustrated in FIG. 2 includes a base material 12, a wiring layer 13 and a wiring pattern 14. The wiring layer 13 is laminated on front and back surfaces of the base material 12. The wiring pattern 14 is formed on the wiring layer 13. The base material 12 includes through hole sites 15 in the surface section 12A. The through hole sites 15 include through holes 15A which penetrate the surface section 12A of the base material 12 from the front surface to the back surface. The through hole sites 15 are formed of an insulating material 16B, such as a resin material, of different coefficient of thermal expansion from that of the base material 12.

Figure 3:
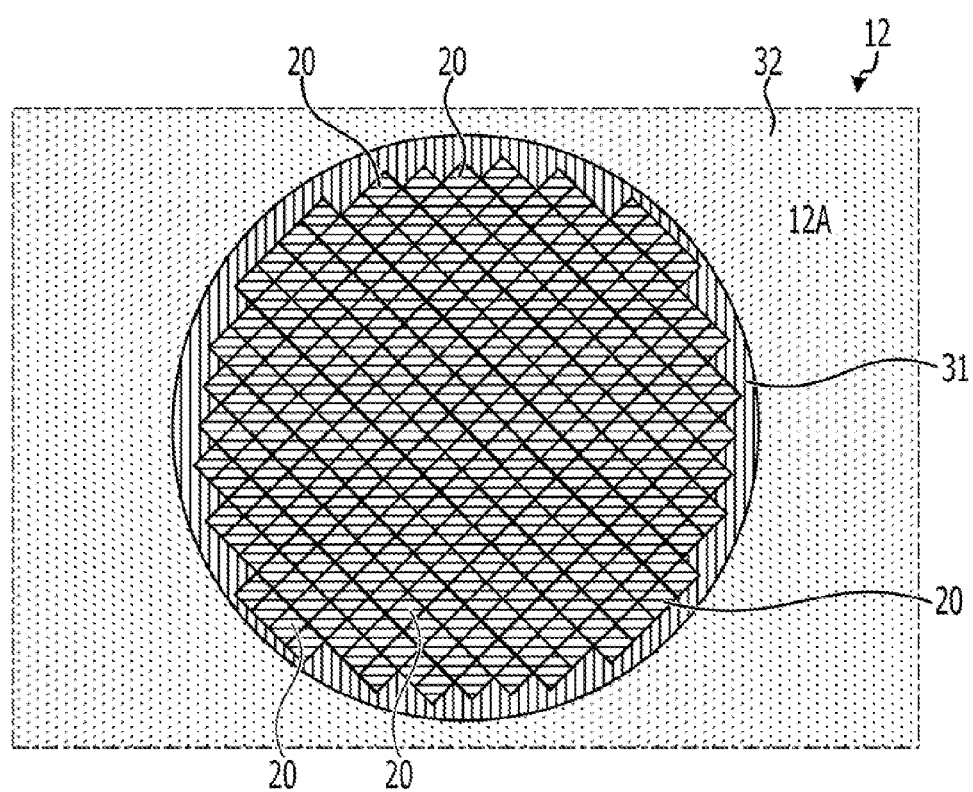
FIG. 3 is a plan view illustrating an outside of a surface section of a base material used in the printed circuit board of the second embodiment.
Figure 4:
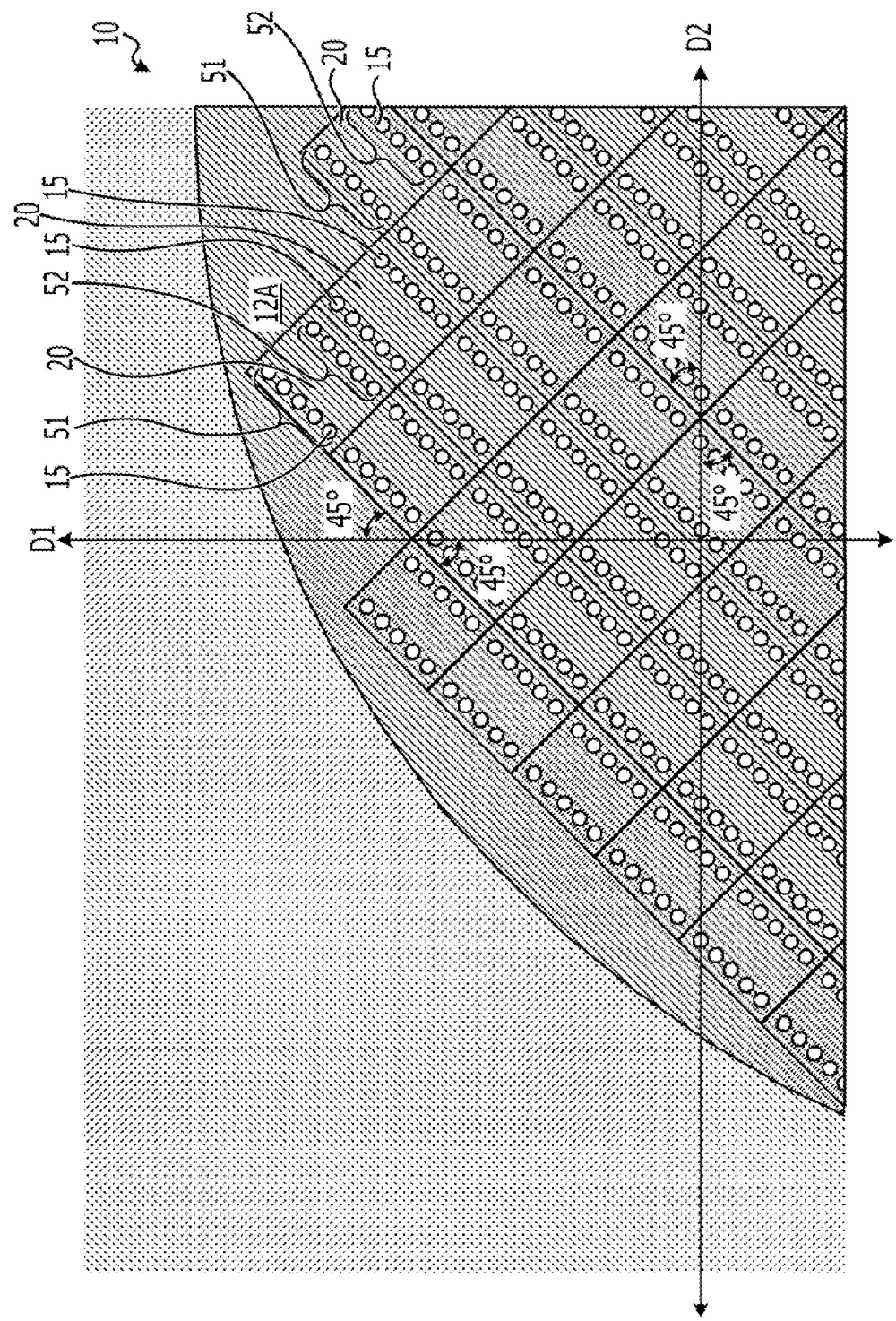
FIG. 4 is a plan view illustrating a part of the printed circuit board of the second embodiment.

FIG. 3 is a plan view illustrating an outside of the surface section 12A of the base material 12 used in the printed circuit board 10 of the second embodiment. FIG. 4 is a plan view illustrating a part of the printed circuit board 10 of the second embodiment. For the ease of description, positions of the through holes sites 15 are illustrated by white circles in FIG. 4. The surface section 12A of the base material 12 illustrated in FIG. 3 includes a product portion 31 and an out-of-product portion 32. A plurality of cells 20 are imposed in the product portion 31.

The base material 12 of the printed circuit board 10 illustrated in FIG. 4 is formed of a prepreg material of fabric which is prepared by knitting, in the horizontal and vertical directions, the fiber threads in the fiber direction D1 and the fiber threads in the fiber direction D2 which is perpendicular to the fiber direction D1. A plurality of cells 20 corresponding to a single chip of a circuit chip (i.e., an electronic component) which is not illustrated, such as a semiconductor chip, are defined on a surface section 12A of the base material 12. The cells 20 are imposed on the surface section 12A of the base material 12 at, for example, 45 degrees with respect to the fiber direction D1. Each of the cells 20 includes through hole sites 15 corresponding to each of connection terminals of the circuit chip and arranged at 45 degrees with respect to the fiber direction D1.

Figure 5:
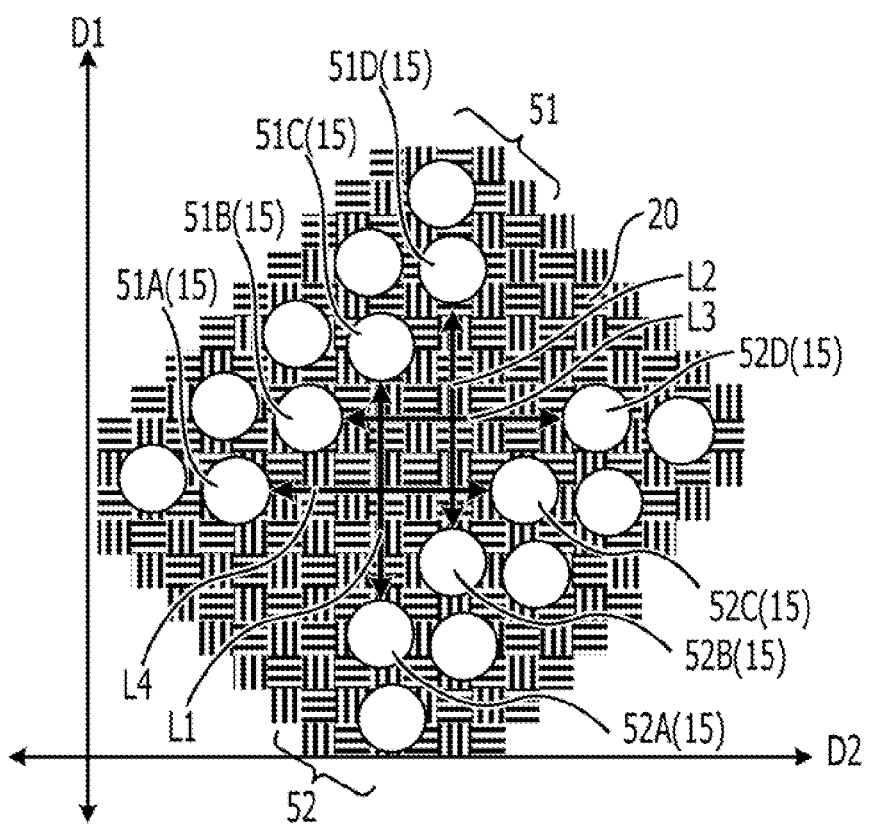
FIG. 5 is an explanatory view illustrating a relationship between through hole sites and a fiber direction in a cell of the second embodiment.

FIG. 5 is an explanatory view illustrating a relationship between the through hole sites 15 and the fiber directions D1 and D2 in the cells 20. Each of the cells 20 includes through hole sites 15 arranged at 45 degrees with respect to the fiber direction D1. The through hole sites 15 in each of the cells 20 include, for example, a first through hole group 51 constituted by nine through hole sites 15 and a second through hole group 52 facing the first through hole group 51 and constituted by nine through hole sites 15. A main part of each of the cells 20 is constituted by through hole sites 51A to 51D of the first through hole group 51 and through hole sites 52A to 52D of the second through hole group 52. Thus, since the through hole sites 15 are arranged at 45 degrees with respect to the fiber direction D1, a relationship of a main part of the first through hole group 51 and a main part of the second through hole group 52 is as follows.

In the fiber threads oriented linearly along the fiber direction D1, the fiber length L1 between the through hole site 51C and the through hole site 52A and the fiber length L2 between the through hole site 51D and the through hole site 52B are the same. In the fiber threads oriented linearly along the fiber direction D2 which is perpendicular to the fiber direction D1, the fiber length L3 between the through hole site 51B and the through hole site 52D and the fiber length L4 between the through hole site 51A and the through hole site 52C are the same. In addition, the fiber lengths L1 and L2 in the fiber direction D1 and the fiber lengths L3 and L4 in the fiber direction D2 are the same. That is, variation in the fiber length of the main parts is reduced.

Figure 6:
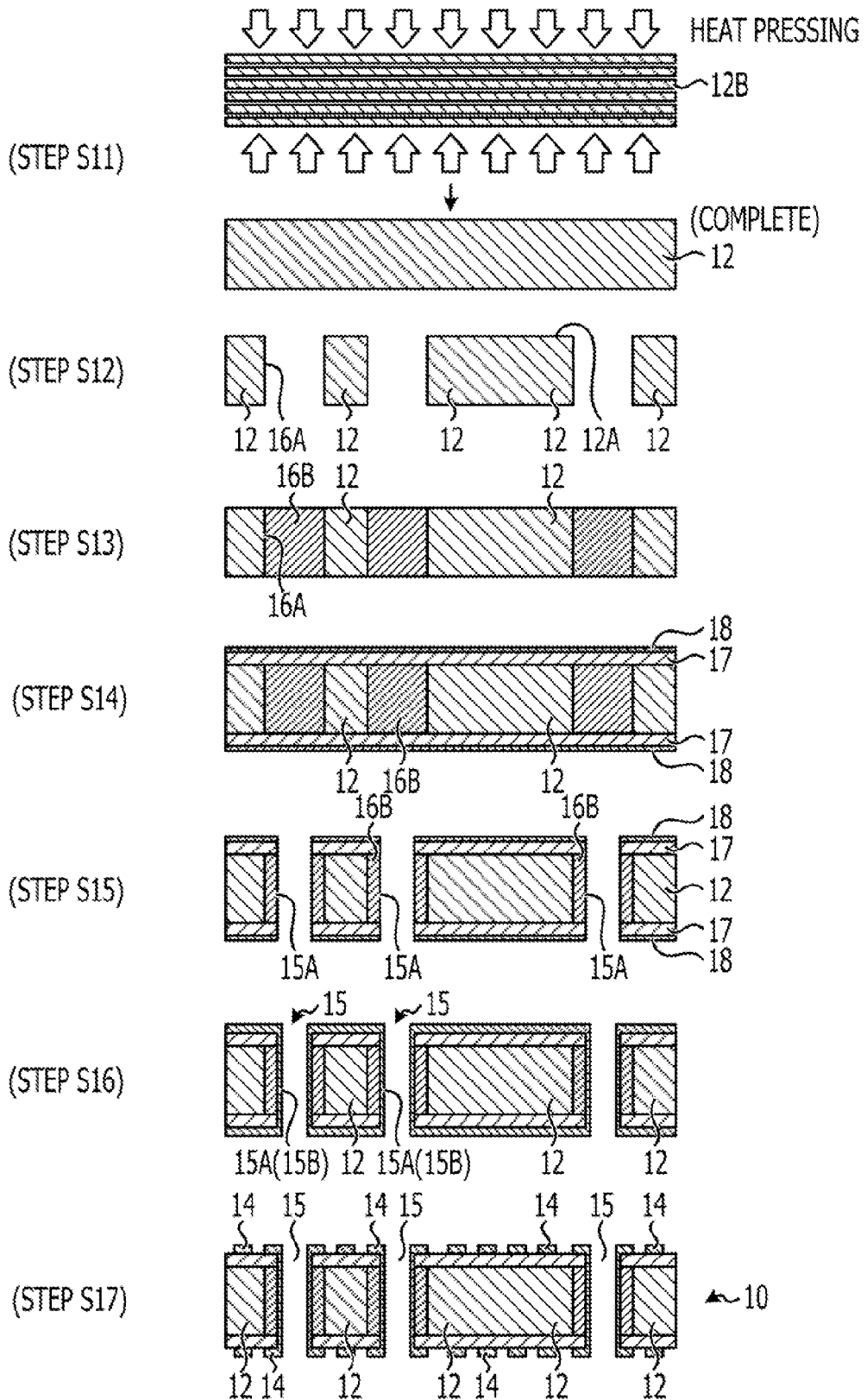
FIG. 6 is an explanatory view illustrating a manufacturing process of the printed circuit board of the second embodiment.

Next, a manufacturing process of the printed circuit board 10 will be described. FIG. 6 is an explanatory view illustrating a manufacturing process of the printed circuit board 10 of the second embodiment. First, in a layout design process, a layout is made such that the cells 20 are imposed at 45 degrees with respect to the fiber direction D1 of the base material 12 when a plurality of cells 20 are defined on the surface section 12A of the base material 12. That is, the first through hole group 51 and the second through hole group 52 in each of the cells 20 are arranged at 45 degrees with respect to the fiber direction D1. In addition, the first through hole group 51 and the second through hole group 52 are arranged such that the fiber lengths L1 and L2 in the fiber direction D1 are the same as the fiber lengths L3 and L4 in the fiber direction D2 of the main part of the first through hole group 51 and the second through hole group 52 in each of the cells 20.

In a base material formation process (step S11), a plurality of prepreg materials 12B which form the base material 12 are laminated to each other and then heat pressed to obtain the base material 12. The prepreg material 12B is a B-stage material prepared by impregnating with fabric of carbon fiber in resin. The fabric of the carbon fiber is a plain-woven fabric prepared by knitting, in the horizontal and vertical directions, the fiber threads in the fiber direction D2 to the fiber threads in the fiber direction D1. The carbon fiber is, for example, fiber having a coefficient of thermal expansion of about 0 ppm/degrees C. and modulus of elasticity of about 370 GPa. This carbon fiber still has the coefficient of thermal expansion of about 0 ppm/degrees C. and modulus of elasticity of about 80 GPa as the property value of a cured low thermal expansion base material (Carbon Fiber Reinforced Plastic (CFRP)) even if resin used in, for example, FR4 is coated thereon.

Next, in a lower hole formation process (step S12), in accordance with the layout design made in the layout design process, lower holes 16A are formed by drilling on the surface section 12A of the base material 12 in accordance with the positions of the through hole sites 15. That is, in the lower hole formation process, the lower holes 16A are arranged at 45 degrees with respect to the fiber direction D1 on the surface section 12A. A diameter of each of the lower holes 16A is, for example, phi 0.8 mm. Note that 25-micrometer copper plating is formed on an internal peripheral wall surface of each of the lower holes 16A in order to prevent contamination of resin by carbon debris produced during the formation of the lower holes 16A.

Next, in an insulating portion formation process (step S13), an insulating material 16B is filled in the lower holes 16A formed on the surface section 12A of the base material 12. The insulating material 16B as a filler is resin in which a silica filler is mixed in order to reduce the coefficient of thermal expansion and has the coefficient of thermal expansion of about 33 ppm/degrees C. and modulus of elasticity of 4.7 GPa. Portions of the insulating material 16B protruding from the surface section 21A of the base material 12 are ground to flatten the surface section 12A.

In a copper foil laminating process (step S14), copper foil 18 is laminated, using the prepreg material 17 of FR4, on the front and back surfaces of the base material 2 on which the insulating material 16B has been formed. The prepreg material 17 is a glass-containing prepreg material which prevents an exposure of the carbon fiber.

In a through hole forming process (step S15), in accordance with the layout design, the through holes 15A are formed by drilling on the front and back surface at the portions filled with the insulating material 16B corresponding to the positions of the through hole sites 15A.

In a through hole plating formation process (step S16), copper plating 15B having the coefficient of thermal expansion of about 17 ppm/degrees C. is formed on an internal peripheral wall surface of each of the formed through holes 15A to form the through hole sites 15 in the cells 20. The copper plating is also formed on the copper foil 18. The through hole sites 15 electrically connect the front and back surfaces of the base material 12. In this manner, the lower holes 16A are arranged at 45 degrees with respect to the fiber direction D1 on the surface section 12A.

In a wiring pattern formation process (step S17), after the copper plating 15B is formed on the internal peripheral wall surface of each of the through holes 15A, a dry film resist (not illustrated) is formed on the copper foil 18. The dry film resist is used as a mask on which a wiring pattern is formed. In the wiring pattern formation process (step S17), a wiring pattern 14 is formed on the surface section 12A by etching the copper foil 18 formed on the surface section 12A of the base material 12. In this manner, a double-sided printed circuit board 10 having the coefficient of thermal expansion of about 3 to 7 ppm/degrees C. has been obtained.

Then, a prototype of a product portion 31 of the base material 12 was prepared and the cells 20 were imposed in a usual manner at an angle of 0 degrees in the fiber direction D1 as illustrated in FIG. 14. Here, the coefficient of thermal expansion X=6.3 ppm/degrees C. and the coefficient of thermal expansion Y=7.0 ppm/degrees C. when the coefficient of thermal expansion in the fiber direction D2 (i.e., the transverse direction) of the base material 12 is X and the coefficient of thermal expansion in the fiber direction D1 (i.e., the longitudinal direction) of the base material 12 is Y. Thus, a difference in the coefficient of thermal expansion in the horizontal and vertical directions is 40.7 ppm/degrees C. Then, as illustrated in FIG. 4, the cells 20 were imposed at 45 degrees with respect to the fiber direction D1 and the coefficient of thermal expansion as obtained similarly. In this case, the coefficient of thermal expansion X=6.8 ppm/degrees C. and the coefficient of thermal expansion Y=7.2 ppm/degrees C. Thus, a difference in the coefficient of thermal expansion in the horizontal and vertical directions is 40.4 ppm/degrees C.

This means that the present invention controls the difference in the coefficient of thermal expansion in the horizontal and vertical directions in the cells 20. Increased arrangement accuracy may let the difference in the coefficient of thermal expansion in the horizontal and vertical directions in the cells 20 be close to substantially "0."

In the second embodiment, since the cells 20 are imposed on the base material 12 at 45 degrees with respect to the fiber direction D1 (or the fiber direction D2) of the base material 2, the fiber lengths L1 and L2 in the fiber direction D1 of the main part of the cells 20 and the fiber lengths L3 and L4 in the fiber direction D2 of the main part of the cells 20 are the same. Thus, a variation in the fiber length of the main part of the cells 20 can be reduced and anisotropy due to the variation in the fiber length can be controlled to the minimum.

In the second embodiment, a dual structure is formed in which a conductive material of carbon fiber is used as a base material 12 and the through hole sites 15 and the base material 12 are electrically insulated with the resin material. In this manner, when fiber of small coefficient of thermal expansion is used, an influence on the difference in coefficient of thermal expansion of different materials due to a variation in fiber length is large. However, even in such a structure, an influence on the difference in coefficient of thermal expansion of different materials due to a variation in fiber length may be controlled to the maximum by reducing the variation in the fiber length.

In the embodiments described above, a plurality of cells 20 were imposed at 45 degrees with respect to the fiber direction D1 of the base material 2, but the cells 20 may be imposed at 45 degrees with respect to the fiber direction D2.

A plurality of cells 20 were imposed at 45 degrees with respect to the fiber direction D1 in the embodiments described above, but the imposing angle is not limited to 45 degrees and, for example, may be 45±10 degrees.

Figure 7:
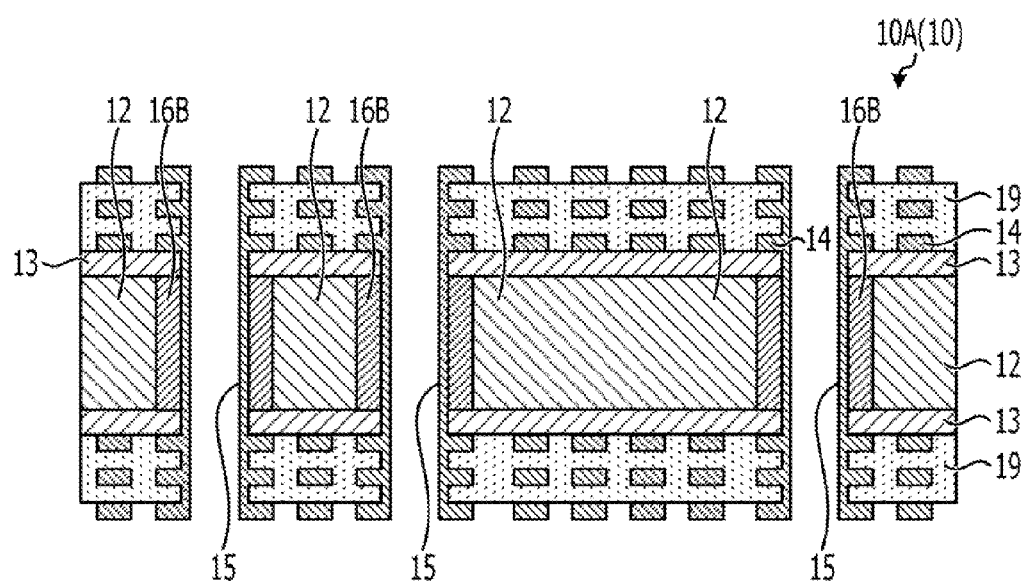
FIG. 7 is a sectional view of a 6-layered printed circuit board.

In the embodiments described above, a double-sided printed circuit board 10 was described as an example as illustrated in FIG. 2, the embodiments may also be applied to a multi-layered printed circuit board. FIG. 7 is a sectional view of a 6-layered printed circuit board. The same components as those of the printed circuit board 10 illustrated in FIG. 2 will be denoted by the same reference numerals and the description thereof regarding structures and operations will be omitted. The 6-layered printed circuit board 10A illustrated in FIG. 7 is prepared in the following manner: a double-sided copper-clad boards 19 on which circuits were formed are provided on the copper foil of the wiring pattern 14 laminated on the front and back surfaces of double-sided printed circuit board 10, and the prepreg materials are laminated to dispose the laminated product therebetween. This means the present embodiment is also applicable to the 6-layered printed circuit board 10A.

Figure 8:
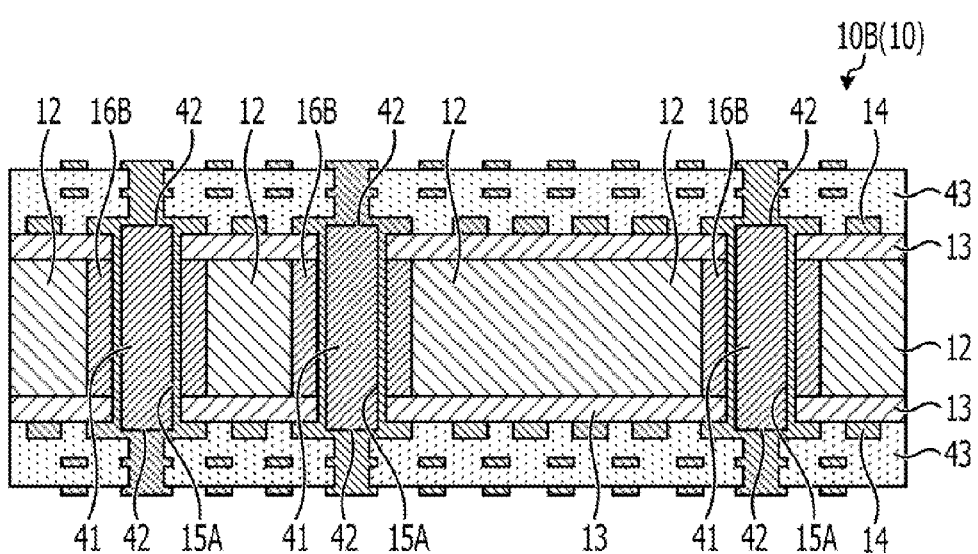
FIG. 8 is a sectional view of a buildup wiring board.

FIG. 8 is a sectional view of a buildup wiring board. The same components as those of the printed circuit board 10 illustrated in FIG. 2 will be denoted by the same reference numerals and the description thereof regarding structures and operations will be omitted. A buildup circuit layer 10B illustrated in FIG. 8 was prepared in the following manner: after the through holes 15A formed in the double-sided printed circuit board 10 are filled with a filler insulating material 41 and lid plating 42 is formed thereon, buildup circuit layers 43 are laminated to dispose a wiring pattern 14 therebetween. This means that the present embodiment is also applicable to buildup circuit layer 10B.

Figure 9:
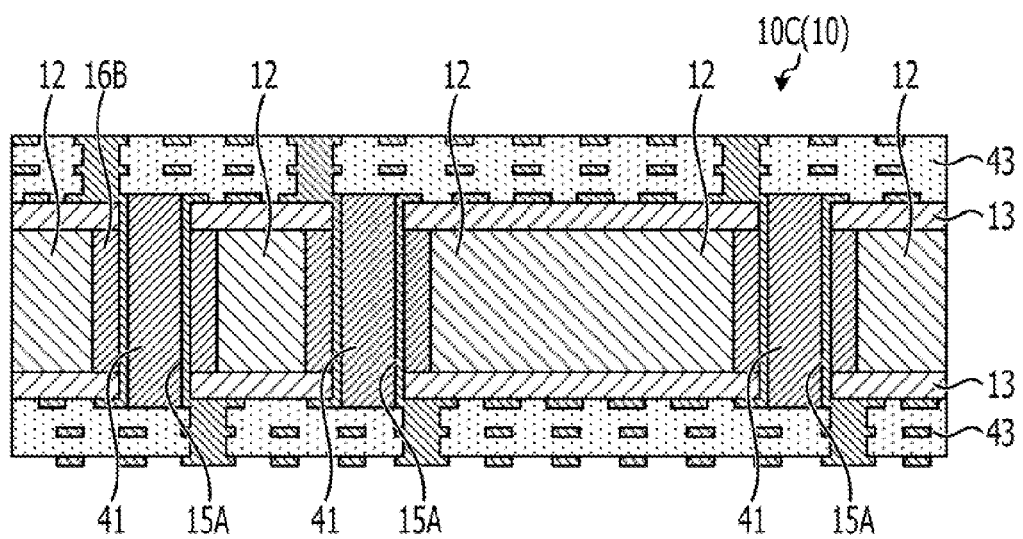
FIG. 9 is a sectional view of a buildup wiring board.

FIG. 9 is a sectional view of a buildup wiring board. The same components as those of the printed circuit board 10 illustrated in FIG. 2 will be denoted by the same reference numerals and the description thereof regarding structures and operations will be omitted. A buildup circuit layer 10C illustrated in FIG. 9 was prepared in the following manner: after the through holes 15A formed in the double-sided printed circuit board 10 are filled with a filler insulating material 41, buildup circuit layers 43 are laminated to dispose a wiring pattern 14 therebetween. This means the present embodiment is also applicable to the buildup circuit layer 10C.

In the examples described above, a conductive material, such as carbon fiber, was used as the base material 12 of the printed circuit board 10 illustrated in FIG. 2, 7 or 9. However, the base material 12 may be formed of a prepreg material in which fabric or nonwoven fabric of organic fiber of an insulating material of aramid fiber, poly-P-benzobisoxazole or aromatic polyester fiber is used as a material for controlling the coefficient of thermal expansion. Since the base material 12 is used as the insulating material, this structure requires no insulating material 16B for electrically insulating between the through holes 15A and the base material 12.

Figure 10:
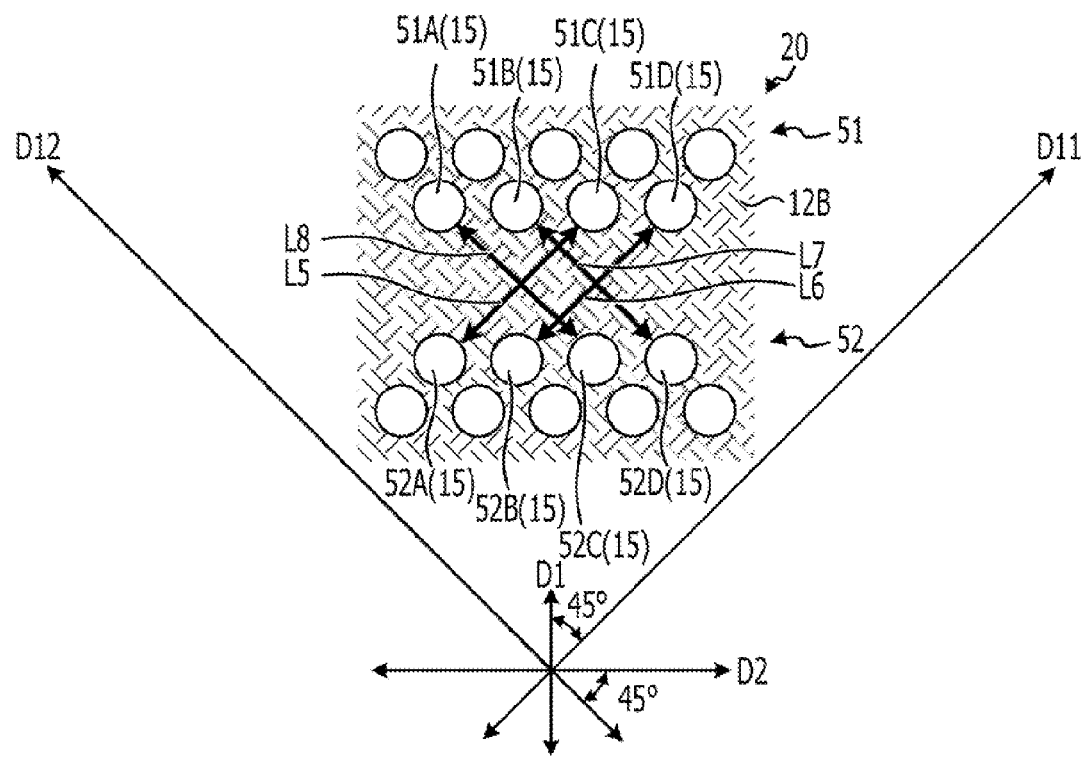
FIG. 10 is an explanatory view illustrating a relationship between through hole sites and a fiber direction in a cell of another embodiment.

In the second embodiment described above, a prepreg material is formed by a laminating method as illustrated in FIG. 10 in which, with the fiber direction D1 being a reference direction, the fiber threads in the fiber direction D11 of which fiber direction is at 45 degrees with respect to the reference fiber direction D1 and the fiber threads in the fiber direction D12 which is perpendicular to the fiber direction D11. Using this prepreg material, a base material 12B of which fiber direction is at 45 degrees as compared with the base material 12 of the second embodiment is formed. The cells 20 may be imposed on the surface section of the base material 12B at 0 degrees or 90 degrees with respect to the fiber direction D1 of a normal arrangement. In this case, the cells 20 may be imposed on the surface section of the base material 12B at 45 degrees with respect to the fiber direction D11 of the base material 12 without changing the imposing direction of the normal arrangement of the cells 20. The fiber lengths L5 and L6 in the fiber direction D11 of the main part and the fiber lengths L7 and L8 in the fiber direction D12 of the main part in the cells 20 are the same. Thus, a variation in fiber length in the fiber direction D11 of the main part and the fiber length in the fiber direction D12 may be reduced and anisotropy due to the variation in the fiber length may be controlled to the minimum.

In the embodiments described above, individual work-sized prepreg materials may be cut out at a direction of 45 degrees from a larger prepreg material and imposition of the normal arrangement may be made to the base materials of the prepreg materials.

A printed circuit board was described as an example in the embodiments described above, but the invention is also applicable to a probe card used for the examination of a semiconductor wafer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A printed circuit board comprising:
   a cell portion having cells in which a plurality of through bores are arranged in a base material; and
   a base material portion which exists around an outer edge of the cell portion, wherein the base material is formed of a prepreg, the prepreg includes a fiber material in which fiber threads are oriented in a first direction and in a second direction which is perpendicular to the first direction, and a resin material in which the fiber material is impregnated; and the through bores, cutting through intersections of the fiber material in the first direction and the fiber material in the second direction, are arranged along a third direction between the first direction and the second direction, wherein one side of the outer edges of the cell extends along the third direction.

2. The printed circuit board according to claim 1, wherein an angle between the third direction and the first direction is an imposing angle of the cells and a plurality of the cells are arranged regularly at the imposing angle.

3. The printed circuit board according to claim 2, wherein the imposing angle is 45 degrees.

4. The printed circuit board according to claim 1, wherein the fiber threads are carbon fiber and an inner wall of the through bore is covered with insulation resin.

5. A method of manufacturing a printed circuit board which includes a cell portion and a base material portion, the cell portion having cells in which a plurality of through bores are arranged in a base material, the base material portion which exists around an outer edge of the cell portion, the method comprising:

forming a base material by heat pressing a prepreg material, the prepreg material includes a resin material and fiber threads, the fiber threads are oriented in a first direction and a second direction which is perpendicular to the first direction; and forming a plurality of through bores in the heat pressed base material, wherein the through bores, cutting through intersections of the fiber material in the first direction and the fiber material in the second direction, are arranged along a third direction between the first direction and the second direction, wherein one side of the outer edges of the cell extends along the third direction.

6. The method of manufacturing a printed circuit board according to claim 5, wherein an angle between the third direction and the first direction is an imposing angle of the cells and a plurality of the cells are arranged regularly at the imposing angle.

7. The method of manufacturing a printed circuit board according to claim 6, wherein the imposing angle is 45 degrees.

* * * * *

UNITED STATES PATENT AND TRADEMARK OFFICE
CERTIFICATE OF CORRECTION

| | | |
|---|---|---|
| PATENT NO. | : 8,754,333 B2 | Page 1 of 1 |
| APPLICATION NO. | : 13/269212 | |
| DATED | : June 17, 2014 | |
| INVENTOR(S) | : Hideaki Yoshimura et al. | |

It is certified that error appears in the above-identified patent and that said Letters Patent is hereby corrected as shown below:

Title Page:

On the Left hand Column of the second page of the Patent, the following publications should be added as shown below:

-- Item (56)    References Cited

OTHER PUBLICATIONS

TSAI, STEPHEN W. "Structural Behavior of Composite Materials", NASA CR-71, 1964.

YAMAGISHI, TOHRU et al., "Structural Analysis of Anisotropic Composite Structures by FEM (Part I)", 1999. --

Signed and Sealed this
Eighteenth Day of November, 2014

Michelle K. Lee
*Deputy Director of the United States Patent and Trademark Office*